(12) United States Patent
Wang et al.

(10) Patent No.: US 9,837,837 B2
(45) Date of Patent: Dec. 5, 2017

(54) PROTECTIVE DEVICE AND PROTECTIVE SYSTEM FOR BATTERY ASSEMBLY WHICH DETECTS DISCONTINUITIES THROUGH VOLTAGE MONITORING

(71) Applicant: BYD COMPANY LIMITED, Shenzhen (CN)

(72) Inventors: Xiaoping Wang, Shenzhen (CN); Qinggang Bai, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 317 days.

(21) Appl. No.: 14/437,301

(22) PCT Filed: Nov. 15, 2013

(86) PCT No.: PCT/CN2013/087259
§ 371 (c)(1),
(2) Date: Apr. 21, 2015

(87) PCT Pub. No.: WO2014/075630
PCT Pub. Date: May 22, 2014

(65) Prior Publication Data
US 2015/0280469 A1    Oct. 1, 2015

(30) Foreign Application Priority Data

Nov. 19, 2012   (CN) .......................... 2012 1 0468019
Nov. 19, 2012   (CN) .................... 2012 2 0611267 U

(51) Int. Cl.
*H02J 7/00*         (2006.01)
*H02H 7/18*       (2006.01)
(Continued)

(52) U.S. Cl.
CPC ............ *H02J 7/0031* (2013.01); *G01R 31/36* (2013.01); *H02H 7/18* (2013.01); *H01M 10/4207* (2013.01)

(58) Field of Classification Search
CPC ......................... G01R 31/026; G01R 31/3658
(Continued)

(56) References Cited

U.S. PATENT DOCUMENTS 4,274,043 A  *  6/1981  Heitz ................ H01M 10/4207
                                                          307/151
4,428,040 A  *  1/1984  Yamashiro ............. G04G 19/00
                                                          363/62

(Continued)

FOREIGN PATENT DOCUMENTS

CN            1141526 A       1/1997
CN            1063590 C       3/2001
(Continued)

*Primary Examiner* — Robert Grant
*Assistant Examiner* — John Trischler
(74) *Attorney, Agent, or Firm* — Anova Law Group, PLLC

(57) ABSTRACT

A protective device and a protective system for a battery assembly are provided. The battery assembly comprises N cells, and the protective device includes: a constant current source module comprising M ($1<M\leq N$) first constant current sources connected in parallel with M cells in the N cells respectively, and configured to generate an output current according to a voltage of the connected cell; a voltage sampling module including N voltage sampling units connected in parallel with the N cells respectively and configured to output a sampling voltage; a determining module connected with the voltage sampling module and configured to generate a first disconnection signal when the sampling voltage output from any voltage sampling unit reaches a predetermined value; and a protective control module, con-
(Continued)

nected with the determining module and configured to control the battery assembly to turn off according to the first disconnection signal.

14 Claims, 11 Drawing Sheets

(51) Int. Cl.
 *G01R 31/36* (2006.01)
 *H01M 10/42* (2006.01)

(58) Field of Classification Search
 USPC .......................................................... 320/134
 See application file for complete search history.

(56) References Cited

U.S. PATENT DOCUMENTS

| | | | | |
|---|---|---|---|---|
| 5,387,857 A * | 2/1995 | Honda | ................... | H02J 7/0016 320/120 |
| 5,530,336 A * | 6/1996 | Eguchi | ................. | H02J 7/0013 320/118 |
| 5,905,361 A * | 5/1999 | Saeki | ................... | H01M 10/425 320/119 |
| 5,998,969 A * | 12/1999 | Tsuji | ..................... | H02J 7/0016 320/130 |
| 6,060,864 A * | 5/2000 | Ito | ................... | G01R 19/16542 320/134 |
| 6,121,752 A * | 9/2000 | Kitahara | ............. | H01M 10/441 320/122 |
| 6,255,826 B1 * | 7/2001 | Ohsawa | ................... | B60K 6/28 320/116 |
| 6,380,763 B1 * | 4/2002 | Ando | .................... | H02J 7/0031 326/68 |
| 6,445,162 B1 * | 9/2002 | Mukainakano | ...... | G01R 31/362 320/132 |
| 6,469,475 B2 * | 10/2002 | Pawlik | ............... | G01R 31/3648 320/134 |
| 6,828,757 B2 * | 12/2004 | Furukawa | ............. | H02J 7/0016 320/116 |
| 6,919,706 B2 * | 7/2005 | Furukawa | .......... | G01R 31/3658 320/116 |
| 7,034,580 B2 * | 4/2006 | Yano | ..................... | H02J 7/0016 320/121 |
| 7,332,891 B2 * | 2/2008 | Sugimoto | ........ | G01R 19/16542 320/116 |
| 7,453,237 B2 * | 11/2008 | Yamamoto | .......... | H01M 2/1022 320/116 |
| 7,638,977 B2 * | 12/2009 | Park | .................... | H01M 10/482 320/134 |
| 7,723,954 B2 * | 5/2010 | Frucht | ................... | H02J 7/0024 320/116 |
| 7,733,059 B2 * | 6/2010 | Yoshida | ............. | G01R 31/3658 320/116 |
| 7,808,209 B2 * | 10/2010 | Fukute | ............... | G01R 31/3624 320/132 |
| RE41,915 E * | 11/2010 | Haraguchi | ............ | H02J 7/0021 320/134 |
| 7,965,061 B2 * | 6/2011 | Li | ......................... | H02J 7/0016 320/116 |
| 8,049,509 B2 * | 11/2011 | Sakurai | ............... | H01M 10/482 324/426 |
| 8,058,845 B2 * | 11/2011 | Tange | ............. | G01R 19/16542 320/134 |
| 8,058,878 B2 * | 11/2011 | Kurose | ................. | B60L 3/0046 320/152 |
| 8,103,401 B2 * | 1/2012 | Kubo | ................. | B60L 11/1855 320/116 |
| 8,163,411 B2 * | 4/2012 | Mizoguchi | .......... | H01M 10/4207 320/134 |
| 8,183,833 B2 * | 5/2012 | Kobayashi | ............ | H02J 7/0014 320/117 |
| 8,264,200 B2 * | 9/2012 | Lum-Shue-Chan | | G01R 31/3658 320/116 |
| 8,269,460 B2 * | 9/2012 | Ishikawa | ................ | B60L 11/14 320/122 |
| 8,288,995 B2 * | 10/2012 | Jimbo | ................... | B60W 10/26 320/126 |
| 8,294,422 B2 * | 10/2012 | Tsumura | ............... | H01M 2/348 320/116 |
| 8,330,469 B2 * | 12/2012 | Miyamoto | ............. | G01R 15/04 320/116 |
| 8,384,353 B2 * | 2/2013 | Miyazaki | ............ | H01M 10/441 320/120 |
| 8,401,728 B2 * | 3/2013 | Kubo | ................... | B60L 11/1855 324/522 |
| 8,502,503 B2 * | 8/2013 | Densham | ............. | H01M 10/42 320/116 |
| 8,508,232 B2 * | 8/2013 | Yugou | ....................... | B60L 7/10 324/426 |
| 8,570,695 B2 * | 10/2013 | Shibuya | .................. | H01M 2/34 361/78 |
| 8,598,847 B2 * | 12/2013 | Eberhard | .............. | H02J 7/0016 320/126 |
| 8,649,935 B2 * | 2/2014 | Kubo | .................. | B60L 11/1855 324/522 |
| 8,674,660 B2 * | 3/2014 | Yamada | ............. | G01R 31/3658 320/134 |
| 8,723,482 B2 * | 5/2014 | Dao | .................... | H01M 10/441 320/104 |
| 8,723,527 B2 * | 5/2014 | Kudo | ................... | B60L 3/0046 320/125 |
| 8,754,654 B2 * | 6/2014 | Furukawa | ........... | H01M 10/441 320/101 |
| 8,797,043 B2 * | 8/2014 | Laber | ................. | G01R 31/026 324/432 |
| 8,836,340 B2 * | 9/2014 | Aoki | ................... | G01R 31/3658 324/433 |
| 8,836,341 B2 * | 9/2014 | Inoue | ................... | G01R 31/025 324/433 |
| 8,841,915 B2 * | 9/2014 | Mizoguchi | ......... | G01R 31/3658 324/426 |
| 8,878,541 B2 * | 11/2014 | Nishizawa | ........... | G01R 31/362 320/116 |
| 8,907,676 B2 * | 12/2014 | Coenen | ................ | G01R 31/026 320/116 |
| 8,930,159 B2 * | 1/2015 | Sugimura | ............ | G01R 31/026 702/117 |
| 8,947,052 B2 * | 2/2015 | Nishizawa | .......... | H01M 10/441 320/134 |
| 8,952,660 B2 * | 2/2015 | Zhang | ............... | H01M 10/4207 320/116 |
| 8,981,783 B2 * | 3/2015 | Fujimatsu | ............ | G01R 31/362 324/116 |
| 9,008,902 B2 * | 4/2015 | Kubo | ................... | B60L 11/1855 324/522 |
| 9,046,584 B2 * | 6/2015 | Tsuchiya | ............ | G01R 31/3658 320/116 |
| 9,130,379 B2 * | 9/2015 | Sakabe | ................. | B60L 3/0046 |
| 9,291,680 B2 * | 3/2016 | Tang | .................. | G01R 31/3658 |
| 9,333,874 B2 * | 5/2016 | Kubo | .................. | B60L 11/1855 |
| 9,340,122 B2 * | 5/2016 | Yamauchi | ........... | B60L 11/1866 |
| 9,373,953 B2 * | 6/2016 | Kimura | ................. | H02J 7/0016 |
| 9,444,267 B2 * | 9/2016 | Suzuki | ................ | B60L 11/1866 |
| 2001/0043054 A1 * | 11/2001 | Pawlik | ............... | G01R 31/3648 320/134 |
| 2003/0062874 A1 * | 4/2003 | Furukawa | ............. | H02J 7/0016 320/121 |
| 2004/0001996 A1 * | 1/2004 | Sugimoto | ........ | G01R 19/16542 429/61 |
| 2004/0041569 A1 * | 3/2004 | Furukawa | .......... | G01R 31/3658 324/433 |
| 2004/0101744 A1 * | 5/2004 | Suzuki | ............... | H01M 2/1016 429/61 |
| 2006/0103349 A1 * | 5/2006 | Yamamoto | .......... | H01M 2/1022 320/116 |
| 2006/0139008 A1 | 6/2006 | Park | | |
| 2006/0220461 A1 | 10/2006 | Miyamoto | | |

(56) References Cited

U.S. PATENT DOCUMENTS

| | | | | |
|---|---|---|---|---|
| 2007/0188138 | A1* | 8/2007 | Kobayashi | H02J 7/0014 320/119 |
| 2007/0229035 | A1* | 10/2007 | Fukute | G01R 31/3624 320/132 |
| 2008/0030167 | A1* | 2/2008 | Hsu | H02J 7/0019 320/119 |
| 2008/0143298 | A1* | 6/2008 | Yoshida | G01R 31/3658 320/136 |
| 2009/0087722 | A1* | 4/2009 | Sakabe | B60L 3/0046 429/61 |
| 2009/0096419 | A1* | 4/2009 | White | B60L 11/1861 320/118 |
| 2009/0130542 | A1* | 5/2009 | Mizoguchi | H01M 10/4207 429/61 |
| 2009/0160407 | A1* | 6/2009 | Hwang | H02J 7/0073 320/157 |
| 2009/0179650 | A1* | 7/2009 | Omagari | G01R 31/3624 324/433 |
| 2009/0198399 | A1* | 8/2009 | Kubo | B60L 11/1855 701/22 |
| 2009/0309545 | A1* | 12/2009 | Kunimitsu | G01R 31/3658 320/118 |
| 2010/0073003 | A1* | 3/2010 | Sakurai | H02J 5/005 324/426 |
| 2010/0079146 | A1* | 4/2010 | Kurose | B60L 3/0046 324/433 |
| 2010/0219792 | A1* | 9/2010 | Tsumura | H01M 2/348 320/116 |
| 2010/0244847 | A1* | 9/2010 | Kudo | B60L 3/0046 324/433 |
| 2010/0289497 | A1* | 11/2010 | Lum-Shue-Chan | G01R 31/3658 324/426 |
| 2010/0327810 | A1* | 12/2010 | Jimbo | B60W 10/26 320/126 |
| 2011/0101918 | A1 | 5/2011 | Tsukamoto et al. | |
| 2011/0149454 | A1* | 6/2011 | Shibuya | H01M 2/34 361/87 |
| 2011/0316549 | A1* | 12/2011 | Coenen | G01R 31/026 324/434 |
| 2012/0013307 | A1* | 1/2012 | Yamada | G01R 31/3658 320/134 |
| 2012/0081128 | A1* | 4/2012 | Laber | G01R 31/026 324/537 |
| 2012/0098547 | A1 | 4/2012 | Inoue et al. | |
| 2012/0112755 | A1* | 5/2012 | Nishizawa | G01R 31/362 324/433 |
| 2012/0133370 | A1* | 5/2012 | Kubo | B60L 11/1855 324/433 |
| 2012/0139491 | A1* | 6/2012 | Eberhard | H02J 7/0016 320/118 |
| 2012/0146652 | A1* | 6/2012 | Aoki | G01R 31/3658 324/433 |
| 2012/0179411 | A1* | 7/2012 | Sugimura | G01R 35/00 702/117 |
| 2012/0206105 | A1* | 8/2012 | Nishizawa | H01M 10/441 320/134 |
| 2012/0306507 | A1* | 12/2012 | Fujimatsu | G01R 31/3658 324/434 |
| 2013/0063080 | A1* | 3/2013 | Shiraishi | H02J 7/0014 320/107 |
| 2013/0113493 | A1* | 5/2013 | Kanno | H01M 10/48 324/426 |
| 2013/0141828 | A1* | 6/2013 | Yamaguchi | H01M 10/44 361/86 |
| 2013/0187659 | A1* | 7/2013 | Kubo | B60L 11/1855 324/433 |
| 2013/0202918 | A1* | 8/2013 | Kimura | H02J 7/0016 429/7 |
| 2013/0214789 | A1* | 8/2013 | Tang | G01R 31/3658 324/431 |
| 2014/0088823 | A1* | 3/2014 | Kubo | B60L 11/1855 701/34.4 |
| 2014/0152261 | A1* | 6/2014 | Yamauchi | B60L 11/1866 320/118 |
| 2014/0232324 | A1* | 8/2014 | Readio | H02J 7/0016 320/107 |
| 2015/0108990 | A1* | 4/2015 | Coenen | G01R 31/026 324/426 |
| 2015/0191102 | A1* | 7/2015 | Kubo | B60L 11/1855 701/34.4 |
| 2015/0207347 | A1* | 7/2015 | Hori | H01M 10/482 320/118 |
| 2016/0013669 | A1* | 1/2016 | Shiraishi | H02J 7/0014 320/118 |
| 2016/0093921 | A1* | 3/2016 | Kadirvel | H01M 10/48 320/112 |

FOREIGN PATENT DOCUMENTS

| | | | |
|---|---|---|---|
| CN | 102468676 A | | 5/2012 |
| CN | 203261012 U | | 10/2013 |
| JP | 01023177 A | * | 1/1989 |
| JP | 06319226 A | * | 11/1994 |
| JP | H08308115 A | | 11/1996 |
| JP | 2001157367 A | | 6/2001 |
| JP | 2002131402 A | * | 5/2002 |
| JP | 2003079139 A | * | 3/2003 |
| JP | 2004104989 A | | 6/2004 |
| JP | 3738721 B2 | | 1/2006 |
| JP | 2006292516 A | | 10/2006 |
| JP | 2011097772 A | | 5/2011 |
| JP | 2012132220 A | | 7/2012 |
| JP | 2012172992 A | | 9/2012 |

* cited by examiner

PROTECTIVE DEVICE AND PROTECTIVE SYSTEM FOR BATTERY ASSEMBLY WHICH DETECTS DISCONTINUITIES THROUGH VOLTAGE MONITORING

CROSS REFERENCE TO RELATED APPLICATIONS

This application is a national phase entry under 35 U.S.C. §371 of International Application No. PCT/CN2013/087259, filed on Nov. 15, 2013, which claims priority and benefits of Chinese Patent Application No. 201210468019.X and No. 201220611267.0, both filed with State Intellectual Property Office, P. R. C. on Nov. 19, 2012, the entire contents of which are incorporated herein by reference.

TECHNICAL FIELD

Embodiments of the present disclosure generally relate to a battery manufacturing filed and, more particularly, to a protective device for a battery assembly and a protective system for a battery assembly.

BACKGROUND

For a battery assembly having a plurality of cells, it is required for a protective device thereof to monitor a voltage of each cell in real time so as to determine the operation state of the battery assembly. If the voltage of the cell cannot be detected accurately and timely when the cell is abnormally connected with the protective device or is disconnected from the protective device, the protective device cannot accurately protect the battery assembly in a charging or discharging state, thus causing damage to the battery assembly or even causing danger. The defect of conventional protective devices is that the detection accuracy is low, which may cause damage to the battery assembly.

SUMMARY

Embodiments of the present disclosure seek to solve at least one of the problems existing in the prior art to at least some extent.

For this, a first objective of the present disclosure is to provide a protective device for a battery assembly, which can detect an abnormal connection or a disconnection between cells of the battery assembly and the protective device timely and accurately, so as to accurately protect the cells in a charging or discharging state, thus reducing or avoiding damage to the cells.

Another objective of the present disclosure is to provide a protective system for a battery assembly, which can detect an abnormal connection or a disconnection between cells of the battery assembly and the protective system timely and accurately, so as to accurately protect the cells in a charging or discharging state, thus reducing or avoiding damage to the cells.

According to embodiments of a first aspect of the present disclosure, a protective device for a battery assembly is provided. The battery assembly comprises N cells (N is an integer greater than 2), and the protective device comprises: a constant current source module comprising M first constant current sources, the M first constant current sources are connected in parallel with M cells in the N cells respectively, and configured to generate an output current according to a voltage of the connected cell, and M is a positive integer smaller than N; a voltage sampling module comprising N voltage sampling units, the N voltage sampling units are connected in parallel with the N cells respectively and configured to output a sampling voltage; a determining module connected with the voltage sampling module and configured to generate a first disconnection signal when the sampling voltage outputted from any one of the N voltage sampling units reaches a predetermined value; and a protective control module, connected with the determining module and configured to control the battery assembly to turn off according to the first disconnection signal.

With the protective device of the present disclosure, an abnormal connection or a disconnection between the cells and the protective device can be detected timely and accurately, such that the protective device can accurately protect the cells in a charging or discharging state, thus reducing or avoiding damage to the cells.

According to embodiments of a second aspect of the present disclosure, a protective system for a battery assembly is also provided. The battery assembly comprises a plurality of cells, and the protective system comprises: a plurality of filtering and regulating modules connected with the plurality of cells respectively; a protective device according to the first aspect of the present disclosure; and a switch module connected in series with the battery assembly and controlled by the protective device to turn off when a connecting wire between the plurality of cells and the protective device breaks.

With the protective system of the present disclosure, an abnormal connection or a disconnection between the cells and the protective device can be detected timely and accurately, such that the protective device can accurately protect the cells in a charging or discharging state, thus reducing or avoiding damage to the cells.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the accompanying drawings, in which.

DETAILED DESCRIPTION

Figure 1:
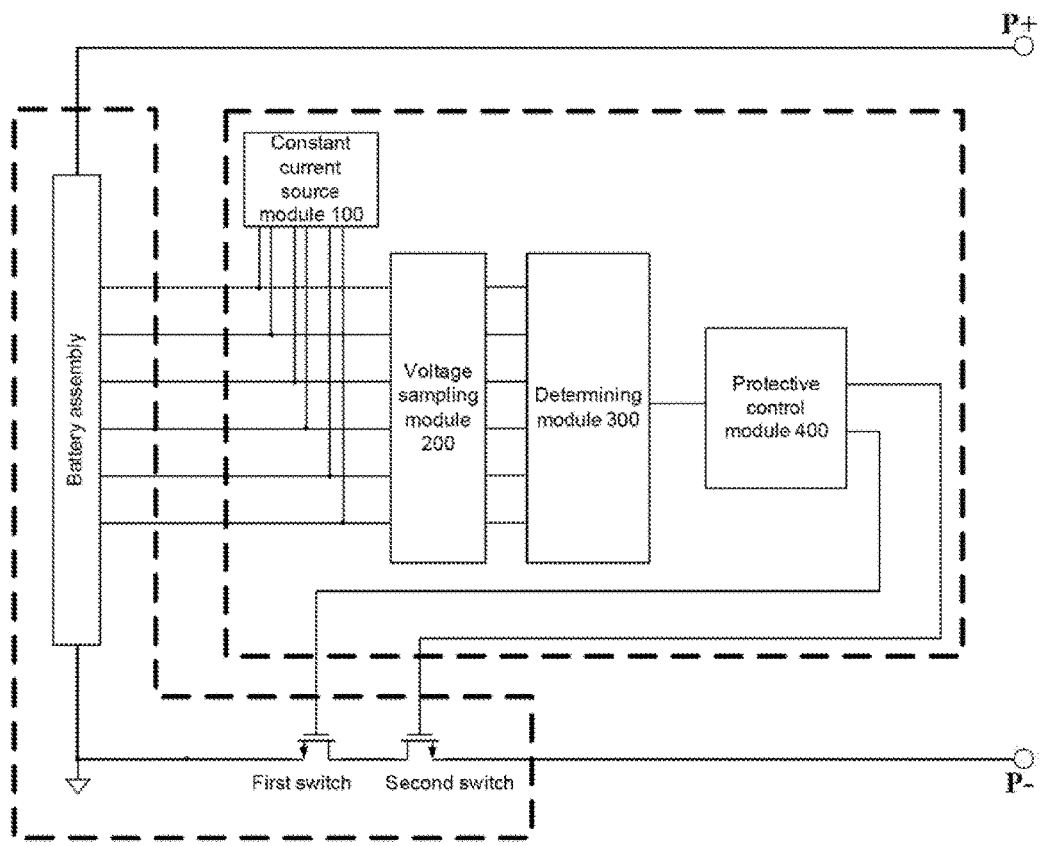
FIG. 1 is a schematic block diagram of a protective device for a battery assembly according to an embodiment of the present disclosure.

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure and shall not be construed to limit the present disclosure. On the contrary, embodiments of the present disclosure include all the changes, alternatives, and modifications all falling into the spirit and principles of the claims and their equivalents.

In the description of the present disclosure, terms such as "first" and "second" are used herein for purposes of description and are not intended to indicate or imply relative importance or significance. In the description of the present disclosure, it should be noted that, terms "connected" and "coupled", refer to a relationship in which structures are secured or attached to one another movably, rigidly or integrally, as well as either directly or indirectly through intervening structures. Further, "connected" and "coupled" are not restricted to physical or mechanical connections or couplings, unless expressly described otherwise. Those having ordinary skills in the art should understand the specific meanings in the present disclosure according to specific situations. In the description of the present disclosure, "more" means two or more than two, unless otherwise specified.

Any process or method described in the flowing diagram or other means may be understood as a module, segment or portion including one or more executable instruction codes of the procedures configured to achieve a certain logic function or process, and the preferred embodiments of the present disclosure includes other performances, in which the performance may be achieved in other orders instead of the order shown or discussed, such as in a almost simultaneous way or in a opposite order, which should be appreciated by those having ordinary skills in the art embodiments of the present disclosure belonging to.

Figure 2:
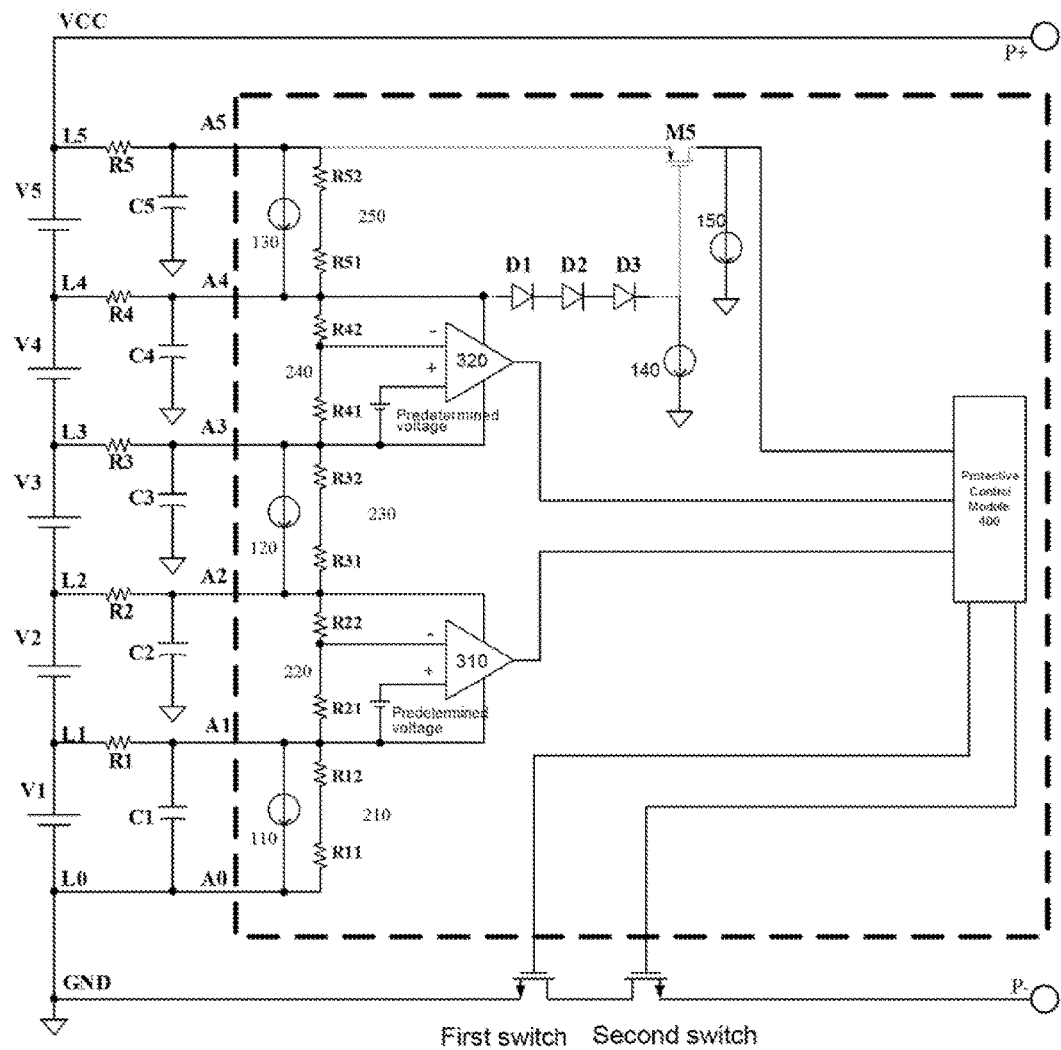
FIG. 2 is a schematic diagram of a protective device for a battery assembly having five cells connected in series according to an embodiment of the present disclosure.

FIG. 1 is a schematic block diagram of a protective device for a battery assembly according to an embodiment of the present disclosure. FIG. 2 is a schematic diagram of a protective device for a battery assembly having five cells connected in series according to an embodiment of the present disclosure. It should be noted that the protective device in FIG. 2 is only exemplary and illustrative, but not used to limit the number of cells in the battery assembly.

As shown in FIG. 1, the battery assembly comprises N cells, in which N is an integer greater than 2. The protective device comprises a constant current source module 100, a voltage sampling module 200, a determining module 300 and a protective control module 400. The constant current source module 100 comprises M first constant current sources, in which M is a positive integer smaller than N. The M first constant current sources are connected in parallel with M cells in the N cells respectively and configured to generate an output current according to a voltage of the connected cell. In other words, when one first constant current source is connected with a cell, the first constant current source outputs a constant current, and when the first constant current source is disconnected from the cell, the current outputted from the first constant current source decreases. The voltage sampling module 200 includes N voltage sampling units. The N voltage sampling units are connected in parallel with the N cells respectively and configured to output a sampling voltage. The determining module 300 is connected with the voltage sampling module 200 and configured to generate a first disconnection signal when the sampling voltage outputted from any one of the N voltage sampling units reaches a predetermined value. The protective control module 400 is connected with the determining module 300 and configured to control the battery assembly to turn off according to the first disconnection signal.

Referring to FIG. 2, the protective device samples voltages of the cells V1, V2, V3, V4, and V5 via terminals A1, A2, A3, A4, and A5 of connecting wires respectively. In FIG. 2, resistors R1, R2, R3, R4 and R5 are low-pass filtering resistors for respective cells V1, V2, V3, V4, and V5, capacitors C1, C2, C3, C4 and C5 are low-pass filtering capacitors for respective cells V1, V2, V3, V4, and V5, and L0, L1, L2, L3, L4 and L5 are voltage sampling wires for respective cells V1, V2, V3, V4, and V5.

In certain embodiments of the present disclosure, a protective voltage threshold for each cell is predetermined. When the protective device is connected with the battery assembly, voltages of the cells V1, V2, V3, V4, and V5 are sampled via terminals A1, A2, A3, A4, and A5 of the connecting wires respectively, and then the sampled voltages are attenuated by the low-pass filtering resistors R1, R2, R3, R4 and R5 respectively. When the voltage sampled by any one of the N voltage sampling units reaches the predetermined voltage threshold, it is determined that a disconnection between the battery assembly and the protective device occurs, and a protective control is operated; and when none of the voltages sampled by the N voltage sampling units reaches the predetermined voltage threshold, the protective device does not operate.

Figure 13:
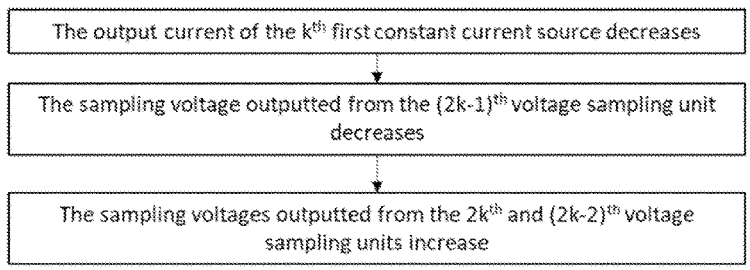
FIGS. 13-15 are flow charts showing the operation of the protective system according to an embodiment of the present disclosure.

In one embodiment, N may be equal to 2M−1 and a $k^{th}$ first constant current source may be connected in parallel with a (2k−1)th cell, in which k is an integer ranging from 1 to M. As shown in FIG. 13, when the output current of the $k^{th}$ first constant current source decreases, the sampling voltage outputted from the $(2k-1)^{th}$ voltage sampling unit decreases, and the sampling voltages outputted from the $2k^{th}$ and $(2k-2)^{th}$ voltage sampling units increase.

Specifically, referring to FIG. 2, the battery assembly has five cells. The constant current source module 100 includes three first constant current sources 110, 120 and 130. The three first constant current sources 110, 120 and 130 are connected in parallel with odd ones of the five cells respectively. In other words, the first constant current source 110 is connected in parallel with the cell V1, the first constant current source 120 is connected in parallel with the cell V3, and the first constant current source 130 is connected in parallel with the cell V5. The first constant current sources 110, 120 and 130 generate output currents according to the voltages of the connected cells respectively. When one connecting wire of the cells breaks, the output current of the first constant current source 110, 120 or 130 will decrease. For example, when the connecting wire between the cells V1 and V2 breaks, the output current of the first constant current source 110 decreases. Again referring to FIG. 2, the voltage sampling module 200 includes five voltage sampling units 210, 220, 230, 240 and 250 connected in parallel with the cells V1, V2, V3, V4 and V5 respectively and configured to output a sampling voltage. In other words, the voltage sampling unit 210 is connected in parallel with the cell V1, the voltage sampling unit 220 is connected in parallel with the cell V2, the voltage sampling unit 230 is connected in parallel with the cell V3, the voltage sampling unit 240 is connected in parallel with the cell V4, and the voltage sampling unit 250 is connected in parallel with the cell V5. Furthermore, the voltage sampling unit 210 is connected in parallel with the first constant current source 110, the voltage sampling unit 230 is connected in parallel with the first constant current source 120, and the voltage sampling unit 250 is connected in parallel with the first constant current source 130. When the output current of any one of the first constant current sources 110, 120 and 130 decreases, the sampling voltage outputted from the voltage sampling unit corresponding to the any one of the first constant current sources 110, 120 and 130 decreases, and the sampling voltages outputted from adjacent voltage sampling units increase. For example, when the output current of the first constant current sources 120 decreases, the sampling voltage outputted from the voltage sampling unit 230 decreases, and the sampling voltages outputted from the voltage sampling units 220 and 240 increase.

In one embodiment, each of the N voltage sampling units comprises a first resistor and a second resistor connected in series. A first node is formed between the first resistor and the second resistor.

Specifically, referring to FIG. 2, the voltage sampling unit 210 includes a first resistor R11 and a second resistor R12 connected in series; the voltage sampling unit 220 includes a first resistor R21 and a second resistor R22 connected in series; the voltage sampling unit 230 includes a first resistor R31 and a second resistor R32 connected in series; the voltage sampling unit 240 includes a first resistor R41 and a second resistor R42 connected in series; and the voltage sampling unit 250 includes a first resistor R51 and a second resistor R52 connected in series.

Figure 14:
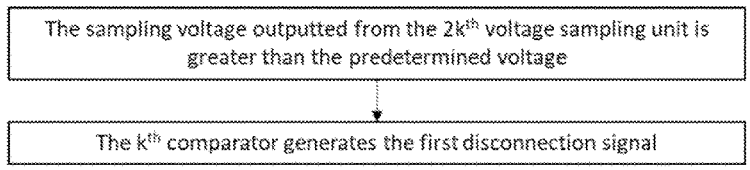

In one embodiment, the determining module 300 comprises M−1 comparators, a first input terminal of a $k^{th}$ comparator is connected with a predetermined voltage and a second input terminal of the $k^{th}$ comparator is connected with a $2k^{th}$ voltage sampling unit, and, as shown in FIG. 14, when the sampling voltage outputted from the $2k^{th}$ voltage sampling unit is greater than the predetermined voltage, the $k^{th}$ comparator generates the first disconnection signal.

Specifically, referring to FIG. 2, the determining module 300 includes two comparators 310 and 320. A first input terminal of each of the comparators 310 and 320 is connected with a predetermined voltage, a second input terminal of the comparator 310 is connected with the first node of the voltage sampling unit 220 connected in parallel with the cell V2, and a second input terminal of the comparator 320 is connected with the first node of the voltage sampling unit 240 connected in parallel with the cell V4.

When the sampling voltage outputted from the voltage sampling unit 220 is greater than the predetermined voltage, the comparator 310 generates the first disconnection signal. When the sampling voltage outputted from the voltage sampling unit 240 is greater than the predetermined voltage, the comparator 320 generates the first disconnection signal. Then, the protective control module 400 controls the battery assembly to turn off (i.e., stop charging or discharging the battery assembly) according to the first disconnection signal.

Figure 15:
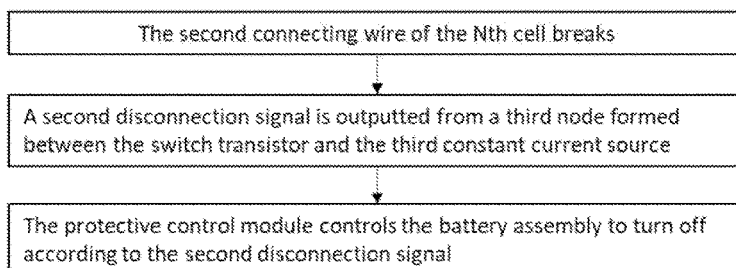

In one embodiment of the present disclosure, the first connecting, wire of the first cell may he grounded, and the constant current source module 100 may further include a second constant current source 140 connected with a first connecting wire of a $N^{th}$ cell and a third constant current source 150 connected with a second connecting wire of the $N^{th}$ cell. The constant current source module 100 may further include a plurality of diodes and a switch transistor. The plurality of diodes are connected in series and connected between the first connecting wire of the $N^{th}$ cell and the second constant current source 140. The switch transistor is connected between the second connecting wire of the $N^{th}$ cell and the third constant current source 150 and controlled by a voltage at a second node formed between the diode and the second constant current source 140. As shown in FIG. 15, when the second connecting wire of the Nth cell breaks, a second disconnection signal is outputted from a third node formed between the switch transistor and the third constant current source 150, and the protective control module controls the battery assembly to turn off according to the second disconnection signal. However, when the first connecting wire and the second connecting wire of the $N^{th}$ cell are connected with each other, no disconnection signal is generated, i.e., the switch transistor is controlled to be turned on by the voltage at the second node, such that the second disconnection signal will not change and the protective device will not function.

As shown in FIG. 2, the constant current source module 100 further comprises three diodes D1, D2 and D3 connected in series. The three diodes D1, D2 and D3 are connected between the terminal A4 and the second constant current source 140, and a second node is formed between the diode D3 and the second constant current source 140. A switch transistor M5 is connected between the terminal A5 and the third constant current source 150 and controlled by a voltage at the second node. The third node is formed between the terminal A5 and the third constant current source 150. When a disconnection occurs at the terminal A5, a second disconnection signal is outputted from the third node.

In some particular applications, the terminals A4 and A5 may be connected together. In such a case, in order to avoid a misjudgment, when terminals A4 and A5 are connected together (i.e., the voltage at the terminal A4 is equal to that at the terminal A5), the switch transistor M5 is controlled to be turned on, such that the second disconnection signal will not change, and the protective device of the present disclosure will not function. In other words, when terminals A4 and A5 are connected with each other, no second disconnection signal is generated.

When the voltage sampling wires L1, L2, L3, L4, and L5 and the low-pass filtering resistors R1, R2, R3, R4, and R5 are connected firmly with the sampling terminals A1, A2, A3, A4, and A5, i.e., no disconnection occurs at terminals A1, A2, A3, A4, and A5, the constant current source module 100 operates normally and extracts constant currents without influencing the voltage sampling. When an abnormal disconnection or even a disconnection exists between the voltage sampling wires L1, L2, L3, L4, and L5 and the sampling terminals A1, A2, A3, A4, and A5, the protective device controls the batter assembly to turn off. Furthermore, when an abnormal disconnection or even a disconnection exists between the low-pass filtering resistors R1, R2, R3, R4, and R5 and the sampling terminals A1, A2, A3, A4, and A5, the protective device also controls the batter assembly to turn off.

In order to understand the present disclosure more clearly, a plurality of operation states of the protective device according to embodiments of the present disclosure are described below with reference to FIG. 2.

(1) Disconnection Occurs at Terminal A1

Since the first constant current source 110 always extracts a constant current from the terminal A1 to the terminal A0, when a disconnection occurs at the terminal A1, the terminal A1 cannot provide a required current for the first constant current source 110, i.e., the output current of the first constant current source 110 decreases, and the voltage between terminals A0 and A1 also decreases. However, since terminals A0 and A2 are connected normally, i.e., the voltage between terminals A0 and A2 is constant, the voltage between terminals A1 and A2 increases when the voltage between terminals A0 and A1 decreases. In other words, the voltage at the first node (i.e., the connecting point of the first resistor R21 and the second resistor R22) of the voltage sampling unit 220 increases. When the voltage at the first node of the voltage sampling unit 220 reaches the predetermined voltage, the comparator 310 outputs the first disconnection signal, and then the protective control module 400 controls the battery assembly to turn off, thus achieving protection for the battery assembly.

(2) Disconnection Occurs at Terminal A2

Since the first constant current source 120 always extracts a constant current from the terminal A3 to the terminal A2, when a disconnection occurs at the terminal A2, the terminal A2 cannot provide a current loop for the first constant current source 120, i.e., the output current of the first constant current source 120 decreases, and the voltage between terminals A2 and A3 also decreases. However, since terminals A1 and A3 are connected normally, i.e., the voltage between terminals A1 and A3 is constant, the voltage between terminals A1 and A2 increases when the voltage between terminals A2 and A3 decreases. In other words, the voltage at the first node (i.e., the connecting point of the first resistor R21 and the second resistor R22) of the voltage sampling unit 220 increases. When the voltage at the first node of the voltage sampling unit 220 reaches the predetermined voltage, the comparator 310 outputs the first disconnection signal, and then the protective control module 400 controls the battery assembly to turn off, thus achieving protection for the battery assembly.

(3) Disconnection Occurs at Terminal A3

Since the first constant current source 120 always extracts a constant current from the terminal A3 to the terminal A2, when a disconnection occurs at the terminal A3, the terminal A3 cannot provide a required current for the first constant current source 120, i.e., the output current of the first constant current source 120 decreases, and the voltage between terminals A2 and A3 also decreases. However, since terminals A2 and A4 are connected normally, i.e., the voltage between terminals A2 and A4 is constant, the voltage between terminals A3 and A4 increases when the voltage between terminals A2 and A3 decreases. In other words, the voltage at the first node (i.e., the connecting point of the first resistor R41 and the second resistor R42) of the voltage sampling unit 240 increases. When the voltage at the first node of the voltage sampling unit 240 reaches the predetermined voltage, the comparator 320 outputs the first disconnection signal, and then the protective control module 400 controls the battery assembly to turn off, thus achieving protection for the battery assembly.

(4) Disconnection Occurs at Terminal A4

Since the first constant current source 130 always extracts a constant current from the terminal A5 to the terminal A4, when a disconnection occurs at the terminal A4, the terminal A4 cannot provide a current loop for the first constant current source 130, i.e., the output current of the first constant current source 130 decreases, and the voltage between terminals A4 and A5 also decreases. However, since terminals A3 and A5 are connected normally, i.e., the voltage between terminals A3 and A5 is constant, the voltage between terminals A3 and A4 increases when the voltage between terminals A4 and A5 decreases. In other words, the voltage at the first node (i.e., the connecting point of the first resistor R41 and the second resistor R42) of the voltage sampling unit 240 increases. When the voltage at the first node of the voltage sampling unit 240 reaches the predetermined voltage, the comparator 320 outputs the first disconnection signal, and then the protective control module 400 controls the battery assembly to turn off, thus achieving protection for the battery assembly.

(5) Disconnection Occurs at Terminal A5

The processing method when a disconnection occurs at the terminal A5 is different from that when a disconnection occurs at the terminal A1, A2, A3 or A4. Since the third constant current source 150 always extracts a constant current from the terminal A5 to the ground via the second connecting wire of the cell V5, when a disconnection occurs at the terminal A5, the third constant current source 150 cannot provide a current for the ground, thus causing the second disconnection signal to be outputted from the third node. Then, the protective control module 400 controls the battery assembly to turn off according to the second disconnection signal, thus achieving protection for the battery assembly.

(6) Disconnection Occurs at Both Terminals A1 and A2

Since terminals A0 and A3 are connected normally, i.e., the voltage between terminals A0 and A3 is constant, when the voltage between terminals A0 and A1 and the voltage between terminals A2 and A3 decrease, the voltage between terminals A1 and A2 increases. In other words, the voltage at the first node (i.e., the connecting point between the first resistor R21 and the second resistor R22) of the voltage sampling unit 220 increases. When the voltage at the first node of the voltage sampling unit 220 reaches the predetermined voltage, the comparator 310 outputs the first disconnection signal, and then the protective control module 400 controls the battery assembly to turn off, thus achieving protection for the battery assembly.

(7) Disconnection Occurs at Both Terminals A3 and A4

Since terminals A2 and A5 are connected normally, i.e., the voltage between terminals A2 and A5 is constant, when the voltage between terminals A2 and A3 and the voltage between terminals A4 and A5 decrease, the voltage between terminals A3 and A4 increases. In other words, the voltage at the first node (i.e., the connecting point between the first resistor R41 and the second resistor R42) of the voltage sampling unit 240 increases. When the voltage at the first node of the voltage sampling unit 240 reaches the predetermined voltage, the comparator 320 outputs the first disconnection signal, and then the protective control module 400 controls the battery assembly to turn off, thus achieving protection for the battery assembly.

Figure 3:
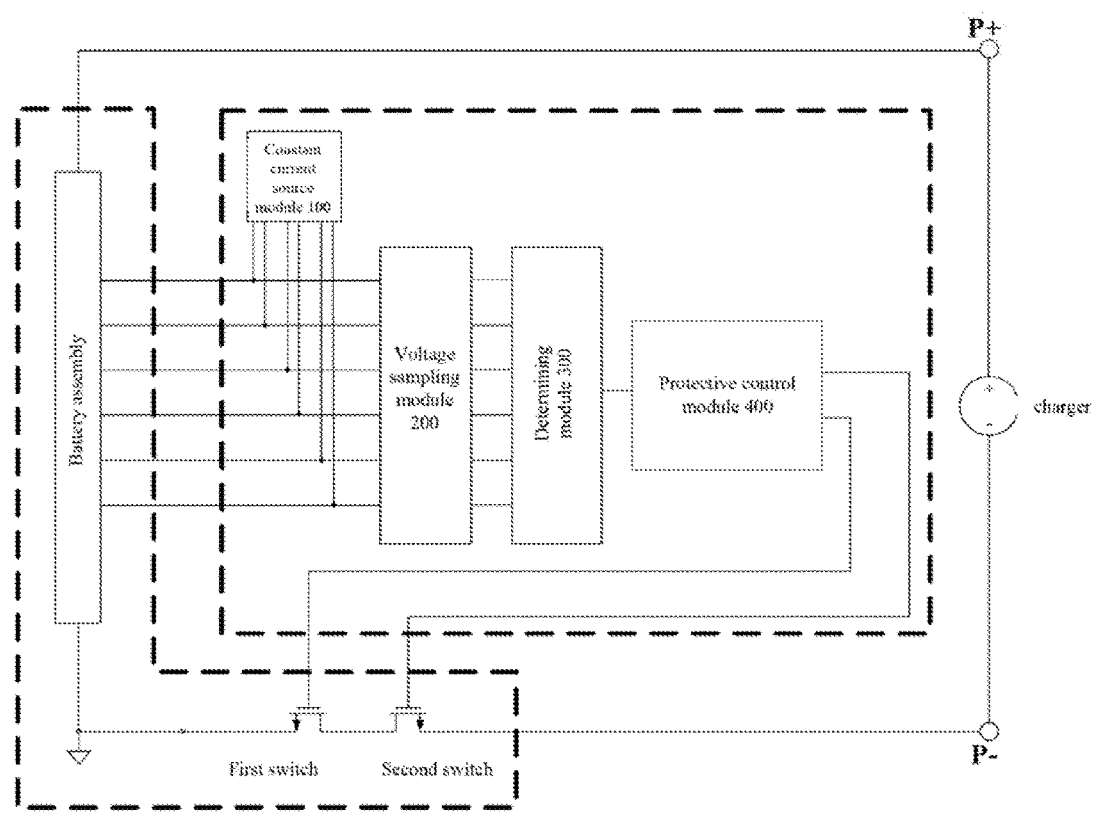
FIG. 3 is a schematic diagram of a protective device for a battery assembly connected with a charger according to an embodiment of the present disclosure.

FIG. 3 is a schematic diagram of a protective device for a battery assembly connected with a charger according to an embodiment of the present disclosure. When a disconnection occurs, the protective control module 400 controls the battery assembly to turn off, thus forbidding the charger to charge the battery assembly.

Figure 4:
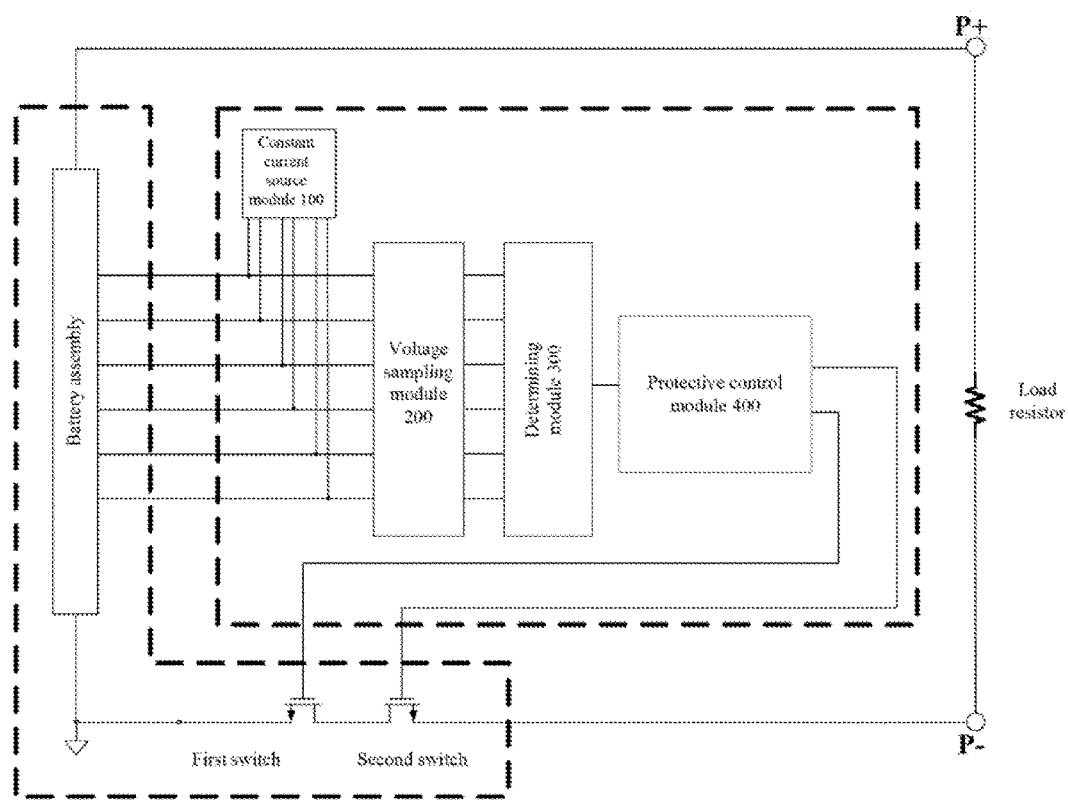
FIG. 4 is a schematic diagram of a protective device for a battery assembly connected with a load resistor according to an embodiment of the present disclosure.

FIG. 4 is a schematic diagram of a protective device for a battery assembly connected with a load resistor according to an embodiment of the present disclosure. When a disconnection occurs, the protective control module 400 controls the battery assembly to turn off, thus forbidding the battery assembly from discharging.

Figure 5:
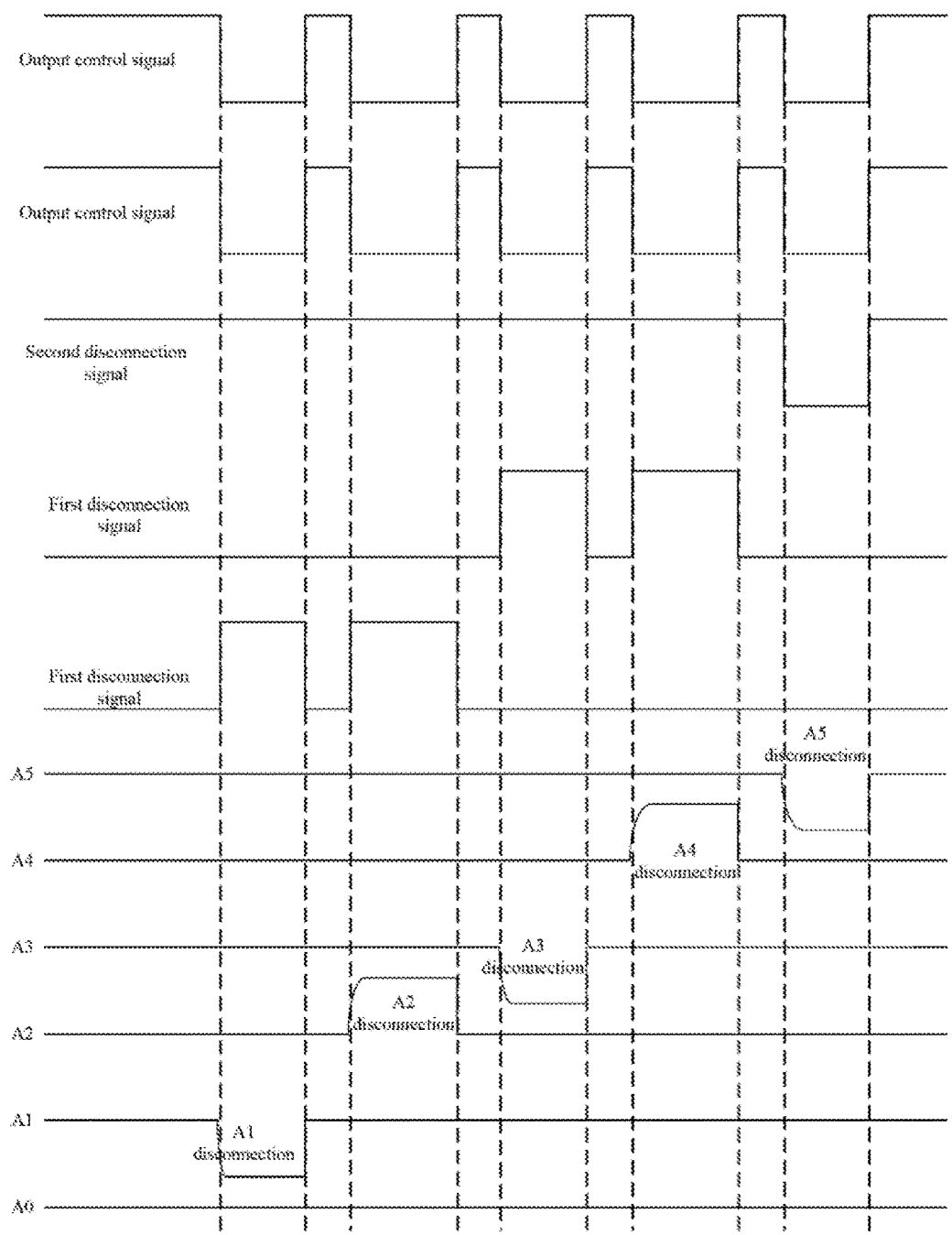
FIG. 5 is a schematic diagram illustrating waveforms of different signals generated by a protective device for a battery assembly according to an embodiment of the present disclosure.

FIG. 5 is a schematic diagram illustrating waveforms of different signals generated by a protective device for a battery assembly according to an embodiment of the present disclosure. As shown in FIG. 5, in some embodiments, when the first disconnection signal is a high level, the output control signal outputted from the protective control module is a low level, and the battery assembly is controlled to be turned off. In some embodiments, as shown in FIG. 5, when the second disconnection signal is a low level, the output control signal outputted from the protective control module is a low level, and the battery assembly is controlled to be turned off. In other embodiments of the present disclosure, when the first disconnection signal is a low level, the battery assembly can be controlled to be turned off; or when the second disconnection signal is a high level, the battery assembly can be controlled to be turned off.

In addition to the above described operation states, other states may also occur, such as a disconnection occurring at both terminals A1 and A3, a disconnection occurring at both terminals A1 and A4, and a disconnection occurring at terminals A1, A2 and A3, the operation principles of which are similar to that of the above states and are omitted herein.

Figure 6:
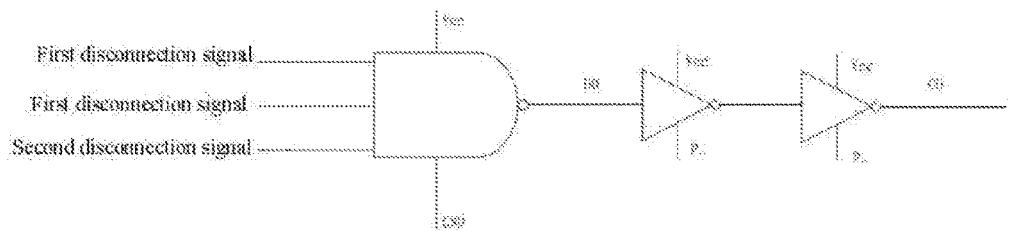
FIG. 6 is a schematic diagram of a protective control module according to an embodiment of the present disclosure.

FIG. 6 is a schematic diagram of a protective control module 400 according to an embodiment of the present disclosure. As shown in FIG. 6, the protective control module 400 comprises an NAND gate and two NOT gates connected in series. Both outputs C0 and D0 are CMOS outputs, and the difference between the outputs C0 and D0 is that the low level outputted from D0 is GND and the low level outputted from C0 is P–. The low levels outputted from D0 and C0 are connected with the first switch and the second switch respectively to control them to turn off.

With the protective device of the present disclosure, an abnormal connection or a disconnection between the cells and the protective device can be detected timely and accurately, such that the protective device can accurately protect the cells in a charging or discharging state, thus reducing or avoiding damage to the cells.

Figure 7:
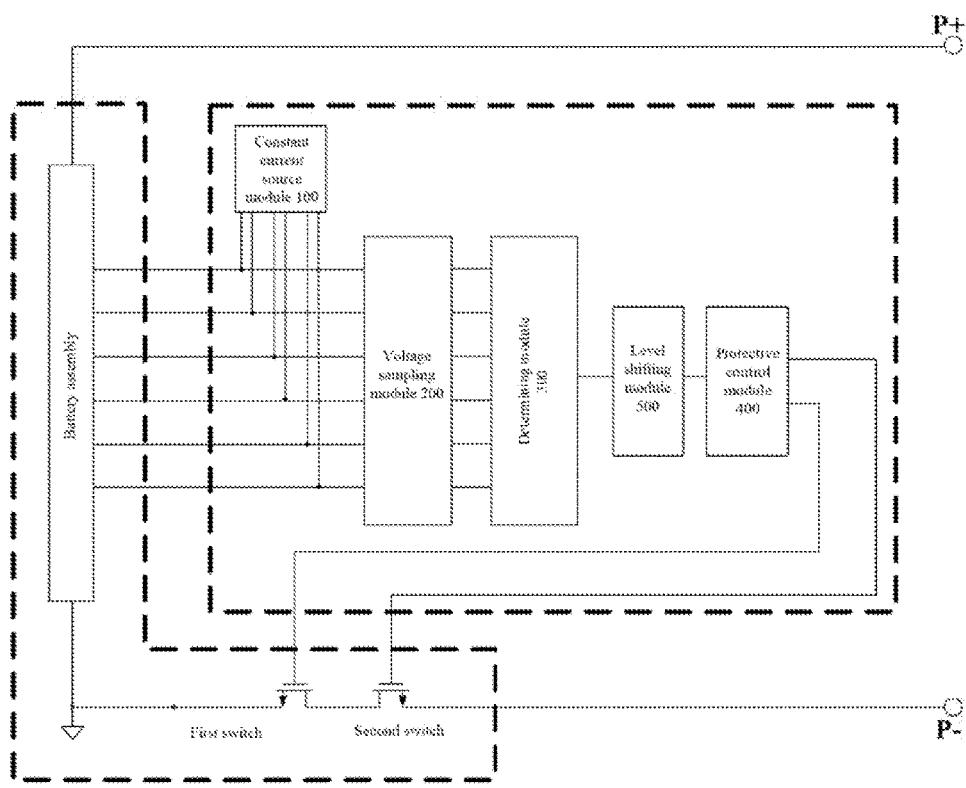
FIG. 7 is a schematic block diagram of a protective device for a battery assembly according to another embodiment of the present disclosure.
Figure 8:
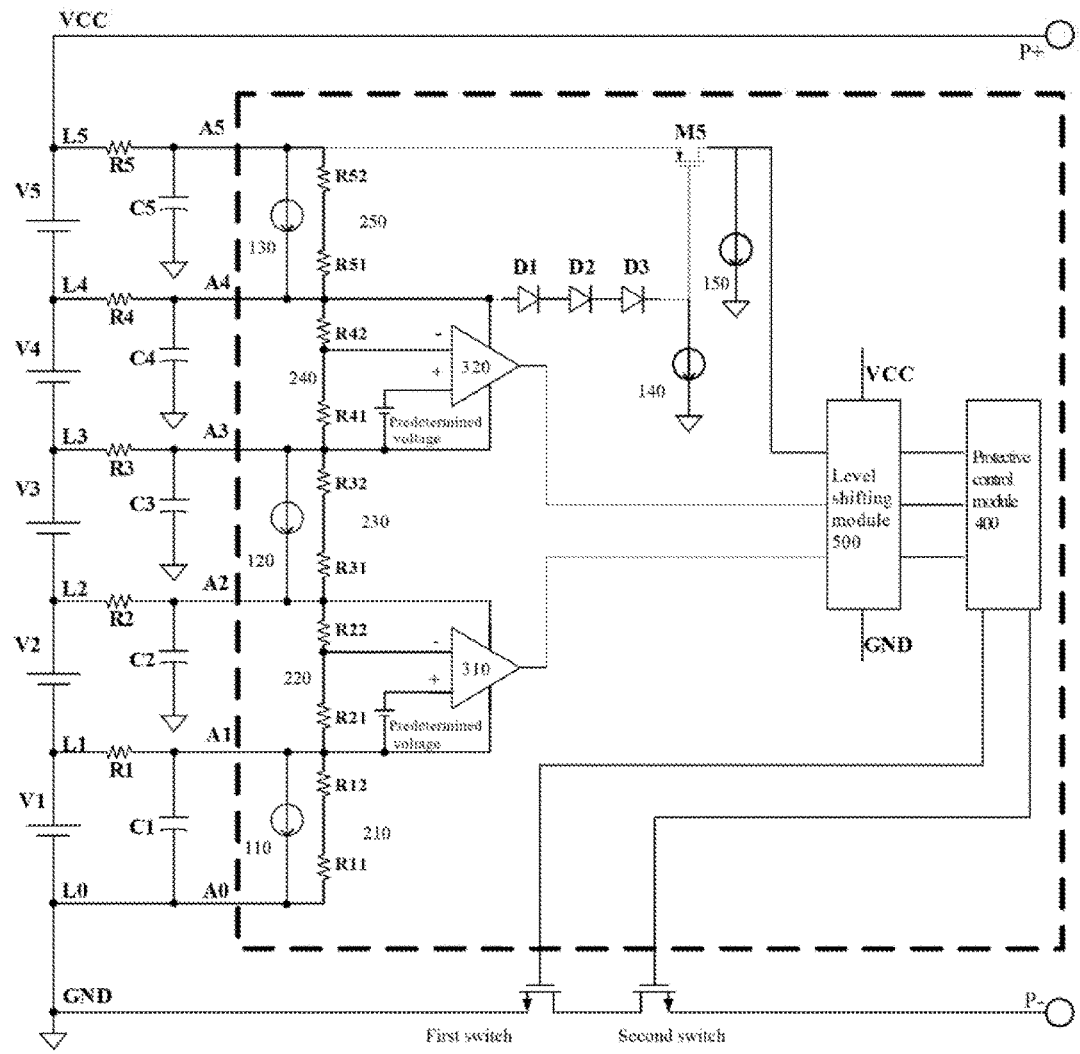
FIG. 8 is a schematic diagram of a protective device for a battery assembly having five cells connected in series according to another embodiment of the present disclosure.

FIG. 7 is a schematic block diagram of a protective device for a battery assembly according to another embodiment of the present disclosure. FIG. 8 is a schematic diagram of a protective device for a battery assembly having five cells connected in series according to another embodiment of the present disclosure. It should be noted that the protective device in FIG. 8 is only exemplary and illustrative, but not used to limit the number of cells in the battery assembly.

As shown in FIG. 7, the battery assembly comprises N cells, in which N is an integer greater than 2. The protective device comprises a constant current source module 100, a voltage sampling module 200, a determining module 300, a level shifting module 500 and a protective control module 400. The constant current source module 100 comprises M first constant current sources, in which M is a positive integer smaller than N. The M first constant current sources are connected in parallel with M cells in the N cells respectively and configured to generate an output current according to a voltage of the connected cell. In other words, when one first constant current source is connected with a cell, the first constant current source outputs a constant current, and when the first constant current source is disconnected from the cell, the current outputted from the first constant current source decreases. The voltage sampling module 200 includes N voltage sampling units. The N voltage sampling units are connected in parallel with of the N cells respectively and configured to output a sampling voltage. The determining module 300 is connected with the voltage sampling module 200 and configured to generate a first disconnection signal when a sampling voltage outputted from any one of the N voltage sampling units reaches a predetermined value. The level shifting module 500 is connected with the determining module 300 and configured to convert the first disconnection signal to a level shifting signal and to transmit the level shifting signal to the protective control module 400. The protective control module 400 is connected with the level shifting module 500 and configured to control the battery assembly to turn off according to the level shifting signal.

Referring to FIG. 8, the protective device samples voltages of the cells V1, V2, V3, V4, and V5 via terminals A1, A2, A3, A4, and A5 of connecting wires respectively. In FIG. 8, resistors R1, R2, R3, R4 and R5 are low-pass filtering resistors for respective cells V1, V2, V3, V4, and V5, capacitors C1, C2, C3, C4 and C5 are low-pass filtering capacitors for respective cells V1, V2, V3, V4, and V5, and L0, L1, L2, L3, L4 and L5 are voltage sampling wires for respective cells V1, V2, V3, V4, and V5.

In embodiments of the present disclosure, a protective voltage threshold for each cell is predetermined. When the protective device is connected with the battery assembly, voltages of the cells V1, V2, V3, V4, and V5 are sampled via terminals A1, A2, A3, A4, and A5 of the connecting wires respectively, and then the sampled voltages are attenuated by the low-pass filtering resistors R1, R2, R3, R4 and R5 respectively. When the voltage sampled by any one of the N voltage sampling units reaches the predetermined voltage threshold, it is determined that a disconnection between the battery assembly and the protective device occurs, and a protective control is operated; and when none of the voltages sampled by the N voltage sampling units reaches the predetermined voltage threshold, the protective device does not operate.

In one embodiment, N may be equal to 2M−1, and a $k^{th}$ first constant current source may be connected in parallel with a $(2k-1)^{th}$ cell, in which k is an integer ranging from 1 to M. When the output current of the $k^{th}$ first constant current source decreases, the sampling voltage outputted from the $(2k-1)^{th}$ voltage sampling unit decreases, and the sampling voltages outputted from the 2kth and $(2k-2)^{th}$ voltage sampling units increase.

Specifically, referring to FIG. 8, the battery assembly has five cells. The constant current source module 100 includes three first constant current sources 110, 120 and 130. The three first constant current sources 110, 120 and 130 are connected in parallel with odd ones of the five cells respectively. In other words, the first constant current source 110 is connected in parallel with the cell V1, the first constant current source 120 is connected in parallel with the cell V3, and the first constant current source 130 is connected in parallel with the cell V5. The first constant current sources 110, 120 and 130 generate output currents according to the voltages of the connected cells respectively. When one connecting wire of the cells breaks, the output current of the first constant current source 110, 120 or 130 will decrease. For example, when the connecting wire between the cells V1 and V2 breaks, the output current of the first constant current source 110 decreases. Again referring to FIG. 8, the voltage sampling module 200 includes five voltage sampling units 210, 220, 230, 240 and 250 connected in parallel with the cells V1, V2, V3, V4 and V5 respectively and configured to output a sampling voltage. In other words, the voltage sampling unit 210 is connected in parallel with the cell V1, the voltage sampling unit 220 is connected in parallel with the cell V2, the voltage sampling unit 230 is connected in parallel with the cell V3, the voltage sampling unit 240 is connected in parallel with the cell V4, and the voltage sampling unit 250 is connected in parallel with the cell V5. Furthermore, the voltage sampling unit 210 is connected in parallel with the first constant current source 110, the voltage sampling unit 230 is connected in parallel with the first constant current source 120, and the voltage sampling unit 250 is connected in parallel with the first constant current source 130. When the output current of any one of the first constant current sources 110, 120 and 130 decreases, the sampling voltage outputted from the voltage sampling unit corresponding to the any one of the first constant current sources 110, 120 and 130 decreases, and the sampling voltages outputted from adjacent voltage sampling units increase. For example, when the output current of the first constant current sources 120 decreases, the sampling voltage outputted from the voltage sampling unit 230 decreases, and the sampling voltages outputted from the voltage sampling units 220 and 240 increase.

In one embodiment, each of the N voltage sampling units comprises a first resistor and a second resistor connected in series. A first node is formed between the first resistor and the second resistor.

Specifically, referring to FIG. 8, the voltage sampling unit 210 includes a first resistor R11 and a second resistor R12 connected in series; the voltage sampling unit 220 includes a first resistor R21 and a second resistor R22 connected in series; the voltage sampling unit 230 includes a first resistor R31 and a second resistor R32 connected in series; the voltage sampling unit 240 includes a first resistor R41 and a second resistor R42 connected in series; and the voltage sampling unit 250 includes a first resistor R51 and a second resistor R52 connected in series.

In one embodiment, the determining module 300 comprises M-1 comparators, a first input terminal of a $k^{th}$ comparator is connected with a predetermined voltage and a second input terminal of the $k^{th}$ comparator is connected with a $2k^{th}$ voltage sampling unit, and when the sampling voltage outputted from the $2k^{th}$ voltage sampling unit is greater than the predetermined voltage, the $k^{th}$ comparator generates the first disconnection signal.

Specifically, referring to FIG. 8, the determining module 300 includes two comparators 310 and 320. A first input terminal of each of the comparators 310 and 320 is connected with a predetermined voltage, a second input terminal of the comparator 310 is connected with the first node of the voltage sampling unit 220 connected in parallel with the cell V2, and a second input terminal of the comparator 320 is connected with the first node of the voltage sampling unit 240 connected in parallel with the cell V4.

When the sampling voltage outputted from the voltage sampling unit 220 is greater than the predetermined voltage, the comparator 310 generates the first disconnection signal.

When the sampling voltage outputted from the voltage sampling unit 240 is greater than the predetermined voltage, the comparator 320 generates the first disconnection signal. Then, the level shifting module 500 converts the first disconnection signal to the level shifting signal, such that the protective control module 400 controls the battery assembly to turn off (i.e., stop charging or discharging the battery assembly) according to the level shifting signal.

In one embodiment of the present disclosure, the first connecting wire of the first cell may be grounded, and the constant current source module 100 may further include a second constant current source 140 connected with a first connecting wire of a $N^{th}$ cell and a third constant current source 150 connected with a second connecting wire of the $N^{th}$ cell. The constant current source module 100 may further include a plurality of diodes and a switch transistor. The plurality of diodes are connected in series and connected between the first connecting wire of the $N^{th}$ cell and the second constant current source 140. The switch transistor is connected between the second connecting wire of the $N^{th}$ cell and the third constant current source 150 and controlled by a voltage at a second node formed between the diode and the second constant current source 140. When the second connecting wire of the $N^{th}$ cell breaks, a second disconnection signal is outputted from a third node formed between the switch transistor and the third constant current source 150, and the protective control module controls the battery assembly to turn off according to the second disconnection signal. However, when the first connecting wire and the second connecting wire of the $N^{th}$ cell are connected with each other, no disconnection signal is generated, i.e., the switch transistor is controlled to be turned on by the voltage at the second node, such that the second disconnection signal will not change and the protective device will not function.

As shown in FIG. 8, the constant current source module 100 further comprises three diodes D1, D2 and D3 connected in series. The three diodes D1, D2 and D3 are connected between the terminal A4 and the second constant current source 140, and a second node is formed between the diode D3 and the second constant current source 140. A switch transistor M5 is connected between the terminal A5 and the third constant current source 150 and controlled by a voltage at the second node. The third node is formed between the terminal A5 and the third constant current source 150. When a disconnection occurs at the terminal A5, a second disconnection signal is outputted from the third node.

In some particular applications, the terminals A4 and A5 may be connected together. In such a case, in order to avoid a misjudgment, when terminals A4 and A5 are connected together (i.e., the voltage at the terminal A4 is equal to that at the terminal A5), the switch transistor M5 is controlled to be turned on, such that the second disconnection signal will not change, and the protective device of the present disclosure will not function. In other words, when terminals A4 and A5 are connected with each other, no second disconnection signal is generated.

When the voltage sampling wires L1, L2, L3, L4, and L5 and the low-pass filtering resistors R1, R2, R3, R4, and R5 are connected firmly with the sampling terminals A1, A2, A3, A4, A5, i.e., no disconnection occurs at terminals A1, A2, A3, A4, and A5, the constant current source module 100 operates normally and extracts constant currents without influencing the voltage sampling. In other words, the voltage obtained after attenuating a voltage of a normal cell cannot reach the predetermined voltage threshold, and then the protective device will not function and will not influence the normal charging and discharging of the cells. When an abnormal disconnection or even a disconnection exists between the voltage sampling wires L1, L2, L3, L4, and L5 and the sampling terminals A1, A2, A3, A4, and A5, the protective device controls the batter assembly to turn off. Furthermore, when an abnormal disconnection or even a disconnection exists between the low-pass filtering resistors R1, R2, R3, R4, and R5 and the sampling terminals A1, A2, A3, A4, and A5, the protective device also controls the batter assembly to turn off.

In order to understand the present disclosure more clearly, a plurality of operation states of the protective device according to embodiments of the present disclosure are described below referring to FIG. 8.

(1) Disconnection Occurs at Terminal A1

Since the first constant current source 110 always extracts a constant current from the terminal A1 to the terminal A0, when a disconnection occurs at the terminal A1, the terminal A1 cannot provide a required current for the first constant current source 110, i.e., the output current of the first constant current source 110 decreases, and the voltage between terminals A0 and A1 also decreases. However, since terminals A0 and A2 are connected normally, i.e., the voltage between terminals A0 and A2 is constant, the voltage between terminals A1 and A2 increases when the voltage between terminals A0 and A1 decreases. In other words, the voltage at the first node (i.e., the connecting point of the first resistor R21 and the second resistor R22) of the voltage sampling unit 220 increases. When the voltage at the first node of the voltage sampling unit 220 reaches the predetermined voltage, the comparator 310 outputs the first disconnection signal, and then the level shifting module 500 converts the first disconnection signal into a level shifting signal and sends the level shifting signal to the protective control module 400. The protective control module 400 controls the battery assembly to turn off, thus achieving protection for the battery assembly.

(2) Disconnection Occurs at Terminal A2

Since the first constant current source 120 always extracts a constant current from the terminal A3 to the terminal A2, when a disconnection occurs at the terminal A2, the terminal A2 cannot provide a current loop for the first constant current source 120, i.e., the output current of the first constant current source 120 decreases, and the voltage between terminals A2 and A3 also decreases. However, since terminals A1 and A3 are connected normally, i.e., the voltage between terminals A1 and A3 is constant, the voltage between terminals A1 and A2 increases when the voltage between terminals A2 and A3 decreases. In other words, the voltage at the first node (i.e., the connecting point of the first resistor R21 and the second resistor R22) of the voltage sampling unit 220 increases. When the voltage at the first node of the voltage sampling unit 220 reaches the predetermined voltage, the comparator 310 outputs the first disconnection signal, and then the level shifting module 500 converts the first disconnection signal into a level shifting signal and sends the level shifting signal to the protective control module 400. The protective control module 400 controls the battery assembly to turn off, thus achieving protection for the battery assembly.

(3) Disconnection Occurs at Terminal A3

Since the first constant current source 120 always extracts a constant current from the terminal A3 to the terminal A2, when a disconnection occurs at the terminal A3, the terminal A3 cannot provide a required current for the first constant current source 120, i.e., the output current of the first constant current source 120 decreases, and the voltage between terminals A2 and A3 also decreases. However, since terminals A2 and A4 are connected normally, i.e., the voltage between terminals A2 and A4 is constant, the voltage between terminals A3 and A4 increases when the voltage between terminals A2 and A3 decreases. In other words, the voltage at the first node (i.e., the connecting point of the first resistor R41 and the second resistor R42) of the voltage sampling unit 240 increases. When the voltage at the first node of the voltage sampling unit 240 reaches the predetermined voltage, the comparator 320 outputs the first disconnection signal, and then the level shifting module 500 converts the first disconnection signal into a level shifting signal and sends the level shifting signal to the protective control module 400. The protective control module 400 controls the battery assembly to turn off, thus achieving protection for the battery assembly.

(4) Disconnection Occurs at Terminal A4

Since the first constant current source 130 always extracts a constant current from the terminal A5 to the terminal A4, when a disconnection occurs at the terminal A4, the terminal A4 cannot provide a current loop for the first constant current source 130, i.e., the output current of the first constant current source 130 decreases, and the voltage between terminals A4 and A5 also decreases. However, since terminals A3 and A5 are connected normally, i.e., the voltage between terminals A3 and A5 is constant, the voltage between terminals A3 and A4 increases when the voltage between terminals A4 and A5 decreases. In other words, the voltage at the first node (i.e., the connecting point of the first resistor R41 and the second resistor R42) of the voltage sampling unit 240 increases. When the voltage at the first node of the voltage sampling unit 240 reaches the predetermined voltage, the comparator 320 outputs the first disconnection signal, and then the level shifting module 500 converts the first disconnection signal into a level shifting signal and sends the level shifting signal to the protective control module 400. The protective control module 400 controls the battery assembly to turn off, thus achieving protection for the battery assembly.

(5) Disconnection Occurs at Terminal A5

The processing method when a disconnection occurs at the terminal A5 is different from that when a disconnection occurs at the terminal A1, A2, A3 or A4. Since the third constant current source 150 always extracts a constant current from the terminal A5 to the ground via the second connecting wire of the cell V5, when a disconnection occurs at the terminal A5, the third constant current source 150 cannot provide a current for the ground, thus causing the second disconnection signal to be outputted from the third node. Then, the level shifting module 500 converts the second disconnection signal to the level shifting signal and transmits the level shifting signal to the protective module 400, such that the protective control module 400 controls the battery assembly to turn off according to the second disconnection signal, thus achieving protection for the battery assembly.

(6) Disconnection Occurs at Both Terminals A1 and A2

Since terminals A0 and A3 are connected normally, i.e., the voltage between terminals A0 and A3 is constant, when the voltage between terminals A0 and A1 and the voltage between terminals A2 and A3 decrease, the voltage between terminals A1 and A2 increases. In other words, the voltage at the first node (i.e., the connecting point between the first resistor R21 and the second resistor R22) of the voltage sampling unit 220 increases. When the voltage at the first node of the voltage sampling unit 220 reaches the predetermined voltage, the comparator 310 outputs the first disconnection signal, and then the level shifting module 500 converts the first disconnection signal into a level shifting signal and sends the level shifting signal to the protective control module 400. The protective control module 400 controls the battery assembly to turn off, thus achieving protection for the battery assembly.

(7) Disconnection Occurs at Both Terminals A3 and A4

Since terminals A2 and A5 are connected normally, i.e., the voltage between terminals A2 and A5 is constant, when the voltage between terminals A2 and A3 and the voltage between terminals A4 and A5 decrease, the voltage between terminals A3 and A4 increases. In other words, the voltage at the first node (i.e., the connecting point between the first resistor R41 and the second resistor R42) of the voltage sampling unit 240 increases. When the voltage at the first node of the voltage sampling unit 240 reaches the predetermined voltage, the comparator 320 outputs the first disconnection signal, and then the level shifting module 500 converts the first disconnection signal into a level shifting signal and sends the level shifting signal to the protective control module 400. The protective control module 400 controls the battery assembly to turn off, thus achieving protection for the battery assembly.

Figure 9:
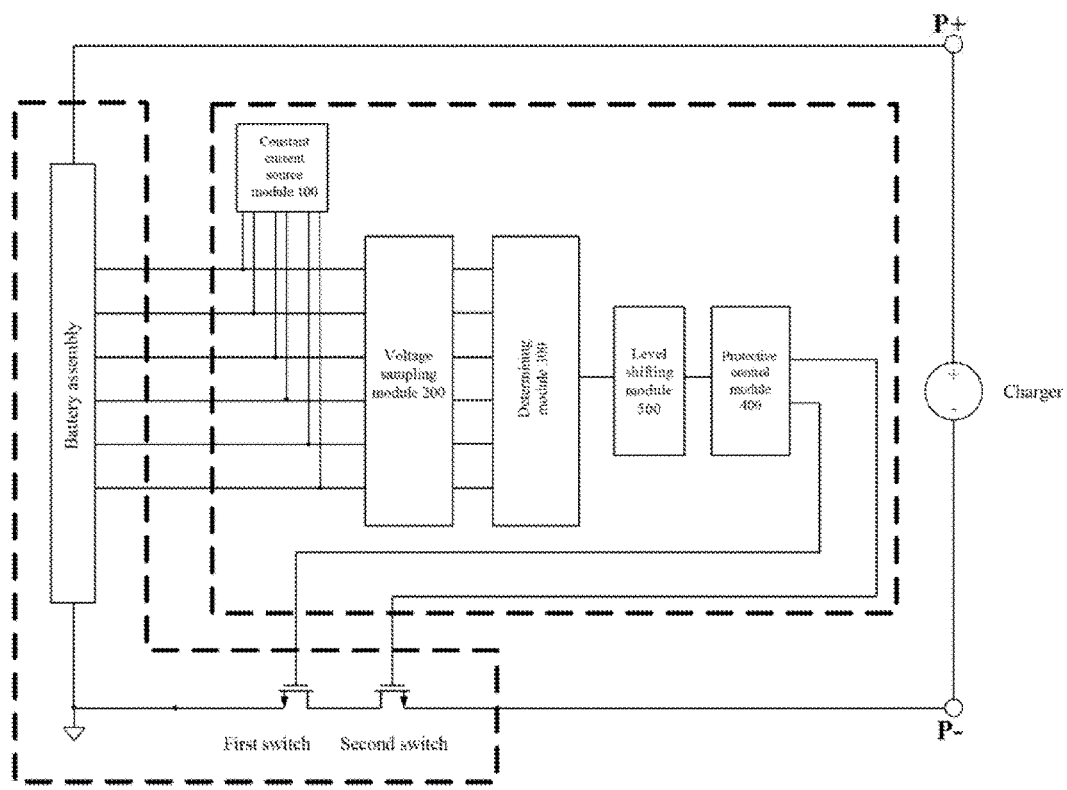
FIG. 9 is a schematic diagram of a protective device for a battery assembly connected with a charger according to another embodiment of the present disclosure.

FIG. 9 is a schematic diagram of a protective device for a battery assembly connected with a charger according to another embodiment of the present disclosure. When a disconnection occurs, the protective control module 400 controls the battery assembly to turn off, thus forbidding the charger to charge the battery assembly.

Figure 10:
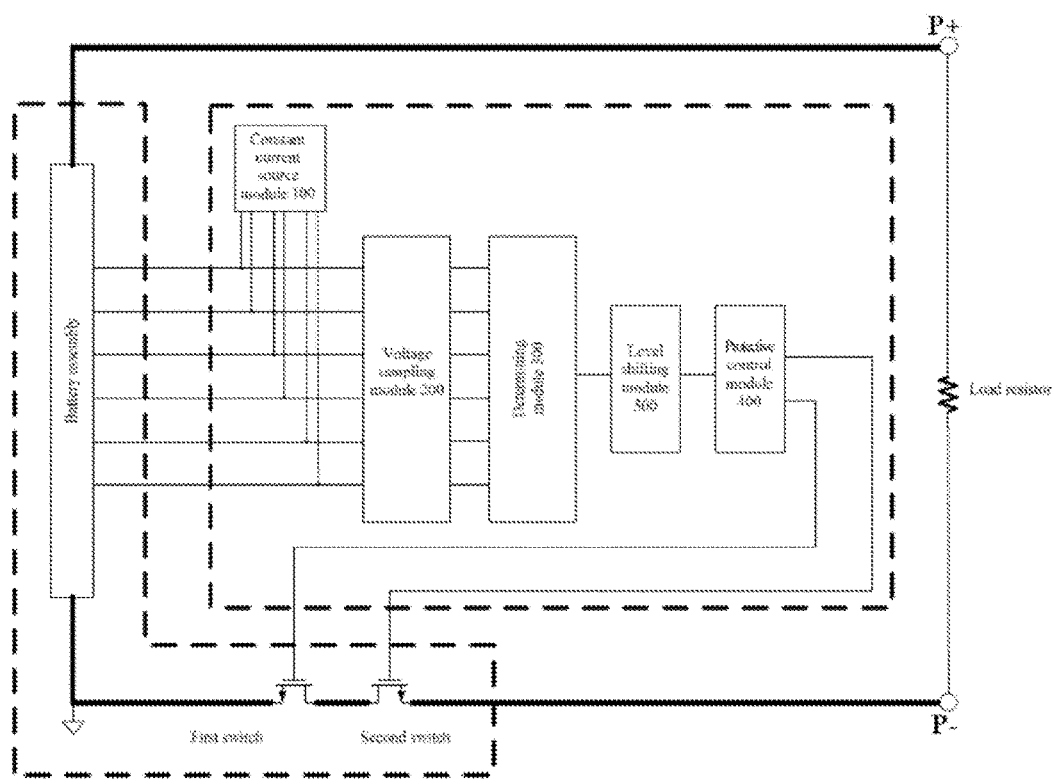
FIG. 10 is a schematic diagram of a protective device for a battery assembly connected with a load resistor according to another embodiment of the present disclosure.

FIG. 10 is a schematic diagram of a protective device for a battery assembly connected with a load resistor according to another embodiment of the present disclosure. When a disconnection occurs, the protective control module 400 controls the battery assembly to turn off, thus forbidding the battery assembly from discharging.

FIG. 5 is a schematic diagram illustrating waveforms of different signals generated by a protective device for a battery assembly according to an embodiment of the present disclosure. As shown in FIG. 5, in some embodiments, when the first disconnection signal is a high level, the output control signal outputted from the protective control module is a low level, and the battery assembly is controlled to be turned off. When the second disconnection signal is a low level, the output control signal outputted from the protective control module is a low level, and the battery assembly is controlled to be turned off. In other embodiments of the present disclosure, when the first disconnection signal is a low level, the battery assembly can be controlled to be turned off; or when the second disconnection signal is a high level, the battery assembly can be controlled to be turned off.

In addition to the above described operation states, other states may also occur, such as a disconnection occurring at both terminals A1 and A3, a disconnection occurring at both terminals A1 and A4, and a disconnection occurring at terminals A1, A2 and A3, the operation principles of which are similar to that of the above states and are omitted herein.

Figure 11A:
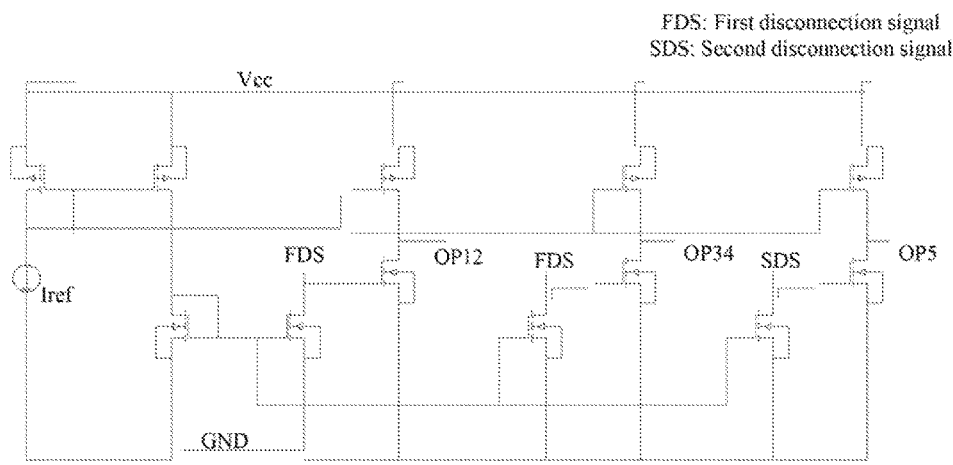
FIG. 11a is a schematic diagram of a level shifting module according to an embodiment of the present disclosure.
Figure 11B:
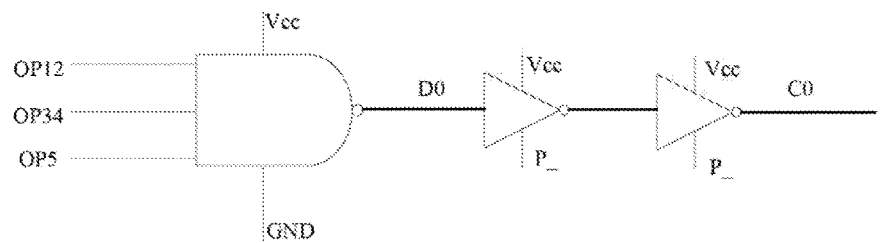
FIG. 11b is a schematic diagram of a protective control module according to another embodiment of the present disclosure.

FIG. 11a is a schematic diagram of a level shifting module 500 according to an embodiment of the present disclosure. FIG. 11b is a schematic diagram of a protective control module 400 according to another embodiment of the present disclosure. As shown in FIG. 11a, Iref is a basic current source for the whole chip, and other components are in mirror-image correlation with each other. As shown in FIG. 11b, the protective control module 400 comprises an NAND gate and two NOT gates connected in series. Both outputs C0 and D0 are CMOS outputs, and the difference between the outputs C0 and D0 is that the low level outputted from D0 is GND and the low level outputted from C0 is P−. The low levels outputted from D0 and C0 are connected with the first switch and the second switch respectively to control them to turn off.

With the protective device of the present disclosure, an abnormal connection or a disconnection between the cells and the protective device can be detected timely and accurately, such that the protective device can accurately protect the cells in a charging or discharging state, thus reducing or avoiding a damage to the cells.

Figure 12:
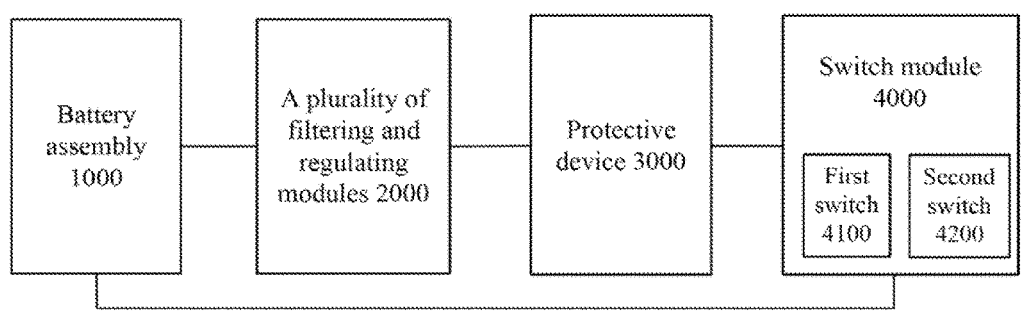
FIG. 12 is a schematic block diagram of a protective system for a battery assembly according to an embodiment of the present disclosure.

FIG. 12 is a schematic block diagram of a protective system for a battery assembly according to an embodiment of the present disclosure. The protective system includes a battery assembly 1000, a plurality of filtering and regulating modules 2000, a protective device 3000 and a switch module 4000.

The battery assembly 1000 comprises a plurality of cells. The plurality of filtering and regulating modules 2000 are connected with the plurality of cells respectively, and a number of the plurality of filtering and regulating modules 2000 is equal to that of the cells. For example, as shown in FIGS. 2 and 8, there are five filtering and regulating modules 2000, and each of the five filtering and regulating modules 2000 comprises a low-pass filtering resistor and a low-pass filtering capacitor. Specifically, a first filtering and regulating module 2000 comprises a low-pass filtering resistor R1 and a low-pass filtering capacitor C1, a second filtering and regulating module 2000 comprises a low-pass filtering resistor R2 and a low-pass filtering capacitor C2, a third filtering and regulating module 2000 comprises a low-pass filtering resistor R3 and a low-pass filtering capacitor C3, a fourth filtering and regulating module 2000 comprises a low-pass filtering resistor R4 and a low-pass filtering capacitor C4, and a fifth filtering and regulating module 2000 comprises a low-pass filtering resistor R5 and a low-pass filtering capacitor C5. A positive electrode of the cell V1 is connected with one end of the low-pass filtering resistor R1, the other end of the low-pass filtering resistor R1 is connected with the voltage sampling terminal A1 and one end of the low-pass filtering capacitor C1 respectively, and the other end of the low-pass filtering capacitor C1 is connected with the voltage sampling terminal A0 and the voltage sampling wire L0 respectively, i.e., connected with a negative electrode of the cell V1. However, a positive electrode of the cell V2 is connected with one end of the low-pass filtering resistor R2, the other end of the low-pass filtering resistor R2 is connected with the voltage sampling terminal A2 and one end of the low-pass filtering capacitor C2 respectively, and the other end of the low-pass filtering capacitor C2 is grounded. The connections between the cells V3, V4, V5 and the corresponding filtering and regulating modules 2000 (i.e. the connection between the cell V3 and the third filtering and regulating module 2000, the connection between the cell V4 and the fourth filtering and regulating module 2000, and the connection between the cell V5 and the fifth filtering and regulating module 2000) are similar to the connection between the cell V2 and the second filtering and regulating module 2000.

The protective device 3000 is as shown in FIGS. 1-11. The switch module 4000 is connected in series with the battery assembly 1000 and controlled by the protective device 3000, and includes a first switch 4100 and a second switch 4200. When a connecting wire between the battery assembly 1000 and the protective device 3000 breaks, the switch module 4000 is controlled to be turned off by the protective device 3000.

It should be appreciated that any portion of the present disclosure may be achieved by hardware, software and firmware or the combination thereof. In the above embodiments of the present disclosure, a plurality of procedures or methods may be achieved by the software and firmware stored in memory and executed by an appropriate command execution system. For example, if the disclosed procedures or methods are achieved by hardware, any one of the following known technologies in the related art or the combination thereof may be adopted. The known technologies in the related art include: discrete logic circuit having logical gating circuit configured to achieve the logical function of the data signal, customized integrated circuit having combinational logical gating circuit, programmable gate array (PGA), field programmable gate array (FPGA).

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A protective device for a battery assembly, wherein the battery assembly comprises N cells, N is an integer greater than 2, and the protective device comprises:
    a constant current source module comprising M first constant current sources, the M first constant current sources being connected in parallel with M cells in the N cells respectively, and configured to generate an output current according to a voltage of the connected cell, wherein M is a positive integer smaller than N;
    a voltage sampling module comprising N voltage sampling units, the N voltage sampling units being connected in parallel with the N cells respectively and configured to output a sampling voltage;
    a determining module connected with the voltage sampling module and configured to generate a first disconnection signal when the sampling voltage outputted from any one of the N voltage sampling units reaches a predetermined value;
    a protective control module, connected with the determining module and configured to control the battery assembly to turn off according to the first disconnection signal; and
    a level shifting module, connected between the determining module and the protective control module and configured to convert the first disconnection signal to a level shifting signal and to transmit the level shifting signal to the protective control module, wherein the protective control module controls the battery assembly to turn off according to the level shifting signal, wherein
    $N=2M-1$, and a $k^{th}$ first constant current source is connected in parallel with a $(2k-1)^{th}$ cell, wherein k is an integer ranging from 1 to M; and
    when the output current of the $k^{th}$ first constant current source decreases, the sampling voltage outputted from the $(2k-1)^{th}$ voltage sampling unit decreases, and the sampling voltages outputted from the $2k^{th}$ and $(2k-2)^{th}$ voltage sampling units increase.

2. The protective device according to claim 1, wherein the determining module comprises M−1 comparators, a first input terminal of a $k^{th}$ comparator is connected with a predetermined voltage and a second input terminal of the $k^{th}$ comparator is connected with a $2k^{th}$ voltage sampling unit, and when the sampling voltage output from the $2k^{th}$ voltage sampling unit is greater than the predetermined voltage, the $k^{th}$ comparator generates the first disconnection signal.

3. The protective device according to claim 2, wherein when any one of the M−1 comparators generates the first disconnection signal, the level shifting module generates the level shifting signal.

4. The protective device according to claim 3, wherein each of the N voltage sampling units comprises a first resistor and a second resistor connected in series.

5. The protective device according to claim 4, wherein the second input terminal of the $k^{th}$ comparator is connected with a first node formed between the first resistor and the second resistor of the $2k^{th}$ voltage sampling unit.

6. The protective device according to claim 1, wherein a first connecting wire of the first cell is grounded, and the constant current source module further comprises a second constant current source connected with a first connecting wire of a $N^{th}$ cell, and a third constant current source connected with a second connecting wire of the $N^{th}$ cell.

7. The protective device according to claim 6, wherein the constant current source module further comprises:
    a plurality of diodes connected in series and connected between the first connecting wire of the $N^{th}$ cell and the second constant current source; and
    a switch transistor connected between the second connecting wire of the $N^{th}$ cell and the third constant current source and controlled by a voltage at a second node formed between the diode and the second constant current source.

8. The protective device according to claim 7, wherein when the second connecting wire of the $N^{th}$ cell breaks, a second disconnection signal is outputted from a third node formed between the switch transistor and the third constant current source, and the protective control module controls the battery assembly to turn off according to the second disconnection signal.

9. The protective device according to claim 7, wherein the switch transistor is controlled to be turned on by the voltage at the second node when the first connecting wire and the second connecting wire of the $N^{th}$ cell are connected with each other.

10. A protective system for a battery assembly, wherein the battery assembly comprises a plurality of cells, and the protective system comprises:
    a plurality of filtering and regulating modules connected with the plurality of respectively;
    a protective device; and
    a switch module connected in series with the battery assembly and controlled by the protective device to turn off when a connecting wire between the plurality of cells and the protective device breaks, wherein the battery assembly comprises N cells, N is an integer greater than 2, and the protective device further comprises:

a constant current source module comprising M first constant current sources, the M first constant current sources being connected in parallel with M cells in the N cells respectively, and configured to generate an output current according to a voltage of the connected cell, wherein M is a positive integer smaller than N;

a voltage sampling module comprising N voltage sampling units, the N voltage sampling units being connected in parallel with the N cells respectively and configured to output a sampling voltage;

a determining module connected with the voltage sampling module and configured to generate a first disconnection signal when the sampling voltage output from any one of the N voltage sampling units reaches a predetermined value; and a protective control module connected with the determining module and configured to control the switch module to turn off according to the first disconnection signal.

11. The protective system according to claim 10, the protective device further comprising:

a level shifting module, connected between the determining module and the protective control module and configured to convert the first disconnection signal to a level shifting signal and to transmit the level shifting signal to the protective control module, wherein the protective control module controls the battery assembly to turn off according to the level shifting signal.

12. The protective system according to claim 11, wherein $N=2M-1$, and a $k^{th}$ first constant current source is connected in parallel with a $(2k-1)^{th}$ cell, wherein k is an integer ranging from 1 to M.

13. The protective system according to claim 12, wherein:

when the output current of the $k^{th}$ first constant current source decreases, the sampling voltage outputted from the $(2k-1)^{th}$ voltage sampling unit decreases, and the sampling voltages outputted from the $2k^{th}$ and $(2k-2)^{th}$ voltage sampling units increase.

14. The protective system according to claim 12, wherein:

the determining module comprises M−1 comparators, a first input terminal of a $k^{th}$ comparator is connected with a predetermined voltage and a second input terminal of the $k^{th}$ comparator is connected with a $2k^{th}$ voltage sampling unit, and when the sampling voltage output from the $2k^{th}$ voltage sampling unit is greater than the predetermined voltage, the $k^{th}$ comparator generates the first disconnection signal.

* * * * *